(12) United States Patent
Chen et al.

(10) Patent No.: US 6,818,533 B2
(45) Date of Patent: Nov. 16, 2004

(54) EPITAXIAL PLASMA ENHANCED CHEMICAL VAPOR DEPOSITION (PECVD) METHOD PROVIDING EPITAXIAL LAYER WITH ATTENUATED DEFECTS

(75) Inventors: Sheng-Hsiung Chen, Taichung County (TW); Shun Long Chen, Hsinchu (TW); Hungtse Lin, Nan-tou (TW); Ming Shing Tsai, Taipei (TW); Lan-Chieh Shih, Koougshiung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/143,470

(22) Filed: May 9, 2002

(65) Prior Publication Data

US 2003/0211712 A1 Nov. 13, 2003

(51) Int. Cl.[7] .............................................. H01L 21/20
(52) U.S. Cl. ....................................... 438/481; 438/478
(58) Field of Search ............................... 438/478, 481, 438/503, 507; 117/87, 92, 103

(56) References Cited

U.S. PATENT DOCUMENTS

| | | | | |
|---|---|---|---|---|
| 3,916,034 A | * | 10/1975 | Tsuchimoto | 427/571 |
| 4,062,706 A | * | 12/1977 | Ruehrwein | 117/93 |
| 4,113,547 A | * | 9/1978 | Katz et al. | 117/88 |
| 4,263,087 A | * | 4/1981 | Tanabe et al. | 117/101 |
| 4,579,609 A | * | 4/1986 | Reif et al. | 117/97 |
| 4,659,401 A | * | 4/1987 | Reif et al. | 117/92 |
| 4,773,355 A | * | 9/1988 | Reif et al. | 118/719 |
| 4,891,091 A | * | 1/1990 | Shastry | 117/90 |
| 5,018,479 A | * | 5/1991 | Markunas et al. | 118/723 IR |
| 5,068,124 A | * | 11/1991 | Batey et al. | 427/579 |
| 5,178,718 A | * | 1/1993 | De Keijser et al. | 117/90 |
| 5,180,435 A | * | 1/1993 | Markunas et al. | 118/723 IR |
| 5,487,358 A | * | 1/1996 | Ohta et al. | 117/200 |

OTHER PUBLICATIONS

Wolf et al., "Silicon Processing for the VLSI ERA vol. 1: Process Technology", 1986, Lattice Press. pp. 133–137.*

* cited by examiner

Primary Examiner—Matthew Smith
Assistant Examiner—Lex Malsawma
(74) Attorney, Agent, or Firm—Tung & Associates

(57) ABSTRACT

Within a plasma enhanced chemical vapor deposition (PECVD) method for forming within a microelectronic fabrication an epitaxial semiconductor layer comprising at least one of silicon and germanium, there is employed a reactant gas composition comprising: (1) at least one of a silicon source material and a germanium source material; and (2) an inert carrier gas. The inert carrier gas provides the epitaxial semiconductor layer with attenuated defects.

13 Claims, 2 Drawing Sheets

EPITAXIAL PLASMA ENHANCED CHEMICAL VAPOR DEPOSITION (PECVD) METHOD PROVIDING EPITAXIAL LAYER WITH ATTENUATED DEFECTS

BACKGROUND OF THE INVENTION

1. Field of the Invention

The present invention relates generally to methods for forming epitaxial layers within microelectronic fabrications. More particularly, the present invention relates to methods for forming, with attenuated defects, epitaxial layers within microelectronic fabrications.

2. Description of the Related Art

Semiconductor integrated circuit microelectronic fabrications are formed from semiconductor substrates within and upon which are formed semiconductor devices and over which are formed patterned conductor layers which are separated by dielectric layers.

As is common in the art of semiconductor integrated circuit microelectronic fabrication, semiconductor devices when formed within and upon semiconductor substrates are typically and preferably formed within and upon epitaxial semiconductor layers (typically epitaxial silicon semiconductor layers) which are formed upon bulk semiconductor substrates (typically bulk silicon semiconductor substrates). Epitaxial semiconductor layers are desirable in the art of semiconductor integrated circuit microelectronic fabrication insofar as epitaxial semiconductor layers may often mask structural defects within bulk semiconductor substrates upon which they are formed.

While epitaxial semiconductor layers are thus clearly desirable in the art of semiconductor integrated circuit microelectronic fabrication and often essential in the art of semiconductor integrated circuit microelectronic fabrication, epitaxial semiconductor layers are nonetheless not entirely without problems in the art of semiconductor integrated circuit microelectronic fabrication.

In that regard, while epitaxial semiconductor layers may often mask structural defects within bulk semiconductor substrates upon which they are formed, epitaxial semiconductor layers are not always themselves readily formed absent defects within the art of semiconductor integrated circuit microelectronic fabrication.

It is thus desirable in the art of semiconductor integrated circuit microelectronic fabrication to provide methods and materials for forming within semiconductor integrated circuit microelectronic fabrications epitaxial semiconductor layers with attenuated defects.

It is towards the foregoing object that the present invention is directed.

Various methods and apparatus have been disclosed in the art of semiconductor integrated circuit microelectronic fabrication for forming, with desirable properties, epitaxial semiconductor layers upon bulk semiconductor substrates employed for forming the semiconductor integrated circuit microelectronic fabrications.

Included among the methods and apparatus, but not limited among the methods and apparatus are methods and apparatus disclosed within: (1) Ruehrwein, in U.S. Pat. No. 4,062,706 (a chemical vapor deposition (CVD) method for forming epitaxial III–V semiconductor layers upon semiconductor substrates absent a hydrogen carrier gas within a chemical vapor deposition (CVD) reactant gas composition, by employing as the chemical vapor deposition (CVD) reactant gas composition: (a) a first reactant gas comprising an inert carrier gas, a hydrogen halide and a group III element gas or vapor; and (b) a second reactant gas comprising an inert carrier gas with a volatile group V compound or a group V element gas or vapor); and (2) Katz et al., in U.S. Pat. No. 4,113,547 (a chemical vapor deposition (CVD) method for forming, with enhanced across substrate uniformity, epitaxial silicon semiconductor layers upon silicon semiconductor substrates employed within silicon semiconductor integrated circuit microelectronic fabrications, by enclosing with a thermally insulative ring within an epitaxial silicon semiconductor layer deposition apparatus a peripheral rim section of a silicon semiconductor substrate prior to forming thereupon an epitaxial silicon semiconductor layer).

Desirable in the art of semiconductor integrated circuit microelectronic fabrication are additional methods and materials which may be employed for forming, with attenuated defects, epitaxial semiconductor layers within semiconductor integrated circuit microelectronic fabrications.

It is towards the foregoing object that the present invention is directed.

SUMMARY OF THE INVENTION

A first object of the present invention is to provide a method for forming an epitaxial semiconductor layer within a semiconductor integrated circuit microelectronic fabrication.

A second object of the present invention is to provide a method in accord with the first object of the present invention, wherein the epitaxial semiconductor layer is formed with attenuated defects.

A third object of the present invention is to provide a method in accord with the first object of the present invention and the second object of the present invention, wherein the method is readily commercially implemented.

In accord with the objects of the present invention, there is provided by the present invention a method for forming an epitaxial semiconductor layer within a semiconductor integrated circuit microelectronic fabrication.

To practice the method of the present invention, there is first provided a monocrystalline substrate. There is then formed over the monocrystalline substrate an epitaxial semiconductor layer while employing a plasma enhanced chemical vapor deposition (PECVD) method. Within the present invention, the epitaxial semiconductor layer comprises at least one of silicon and germanium. Similarly, within the present invention, the plasma enhanced chemical vapor deposition (PECVD) method employs a reactant gas composition comprising: (a) at least one of a silicon source material and a germanium source material; and (b) an inert carrier gas.

The present invention provides a method for forming an epitaxial semiconductor layer within a semiconductor integrated circuit microelectronic fabrication, wherein the epitaxial semiconductor layer is formed with attenuated defects.

The present invention realizes the foregoing object by employing within a plasma enhanced chemical vapor deposition (PECVD) method for forming an epitaxial semiconductor layer upon a monocrystalline substrate, where the epitaxial semiconductor layer comprises at least one of silicon and germanium, a reactant gas composition comprising: (1) at least one of a silicon source material and a germanium source material; and (2) an inert carrier gas.

The method of the present invention is readily commercially implemented.

The present invention employs methods and materials as are generally conventional in the art of semiconductor integrated circuit microelectronic fabrication, but employed within the context of specific process limitations to provide the method of the present invention. Since it is thus at least in part a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming an epitaxial semiconductor layer within a semiconductor integrated circuit microelectronic fabrication, wherein the epitaxial semiconductor layer is formed with attenuated defects.

The present invention realizes the foregoing object by employing within a plasma enhanced chemical vapor deposition (PECVD) method for forming an epitaxial semiconductor layer upon a crystalline substrate, where the epitaxial semiconductor layer comprises at least one of silicon and germanium, a reactant gas composition comprising: (1) at least one of a silicon source material and a germanium source material; and (2) an inert carrier gas.

Although the preferred embodiment of the present invention illustrates the present invention most specifically within the context of forming an epitaxial silicon semiconductor layer upon a silicon semiconductor substrate, the present invention is not so limited. Rather the present invention may be employed for forming epitaxial semiconductor layers including but not limited to epitaxial silicon semiconductor layers, epitaxial silicon-germanium alloy semiconductor layers and epitaxial germanium semiconductor layers, incident to appropriate choice of silicon source material and/or germanium source material when forming an epitaxial silicon layer. The foregoing epitaxial layers may be formed upon monocrystalline substrates including but not limited to monocrystalline non-semiconductor substrates (such as but not limited to sapphire substrates) and monocrystalline semiconductor substrates (such as but not limited to silicon semiconductor substrates, silicon-germanium alloy semiconductor substrates, germanium semiconductor substrates and compound (i.e. III–V) semiconductor substrates).

Referring now to FIG. 1 to FIG. 4, there is shown a series of schematic cross-sectional diagrams illustrating the results of progressive stages of forming within a semiconductor integrated circuit microelectronic fabrication, and in accord with a preferred embodiment of the present invention, a field effect transistor (FET) device.

Figure 1:
FIG. 1, FIG. 2, FIG. 3 and FIG. 4 show a series of schematic cross-sectional diagrams illustrating the results of progressive stages of forming, in accord with a preferred embodiment of the present invention, a field effect transistor (FET) device within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10. As is understood by a person skilled in the art, and as is noted above, while the present invention may be employed within the context of any of several semiconductor substrates, for the preferred embodiment of the present invention the semiconductor substrate 10 is typically and preferably a silicon semiconductor substrate, such as but not limited to a (100) silicon semiconductor substrate.

Figure 2:
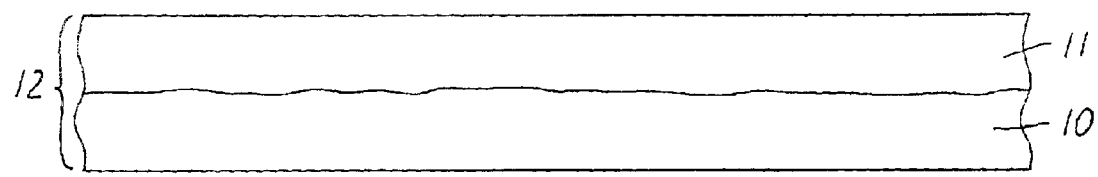

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is formed upon the semiconductor substrate 10 an epitaxial layer 11, to provide in an aggregate an epitaxial semiconductor substrate 12.

Within the preferred embodiment of the present invention, the epitaxial layer 11 is typically and preferably an epitaxial silicon layer, and the epitaxial layer 11 is formed employing a plasma enhanced chemical vapor deposition (PECVD) method which in particular employs a reactant gas composition comprising a silicon source material gas and an inert carrier gas. Typically and preferably, the silicon source material gas is silane, although other silicon source material gases, such as but not limited to disilane and various chlorosilanes, may also be employed. Typically and preferably, the inert carrier gas (which is intended as a noble gas inert carrier gas) is argon, although other inert carrier gases, such as but not limited to helium, neon, krypton and xenon may also be employed. Most typically and preferably, within the preferred embodiment of the present invention, the epitaxial layer 11 is formed employing the plasma enhanced chemical vapor deposition (PECVD) method employing the reactant gas composition which comprises in addition to the silicon source material gas and the inert carrier gas: (1) an appropriate dopant source material gas or vapor; and (2) a hydrogen carrier gas.

Typically and preferably, the inert carrier gas is present at from about 0.5 to about 70 volume percent an aggregate of the silicon source material gas and the hydrogen carrier gas, more preferably from about 1 to about 60 volume percent and most preferably from about 10 to about 50 volume percent.

Typically and preferably, the plasma enhanced chemical vapor deposition (PECVD) method also employs: (1) a reactor chamber pressure of from about 1 mtorr to about 1000 mtorr; (2) a radio frequency source power of from about 10 to about 400 watts and a bias power of from about 10 to about 200 watts; (3) a semiconductor substrate 10 temperature of from about 900 to about 1200 degrees centigrade; (4) a silane flow rate of from about 10 to about 1000 standard cubic centimeters per minute (sccm); (5) a dopant flow rate of from about 10 to about 1000 standard cubic centimeters per minute (sccm); (6) a hydrogen flow rate of from about 10 to about 1000 standard cubic centimeters per minute (scam); and (7) an argon flow rate of from about 10 to about 200 standard cubic centimeters per minute (sccm).

Typically and preferably, the epitaxial layer 11 is formed to a thickness of from about 0.01 to about 100 microns upon the semiconductor substrate 10.

Figure 3:
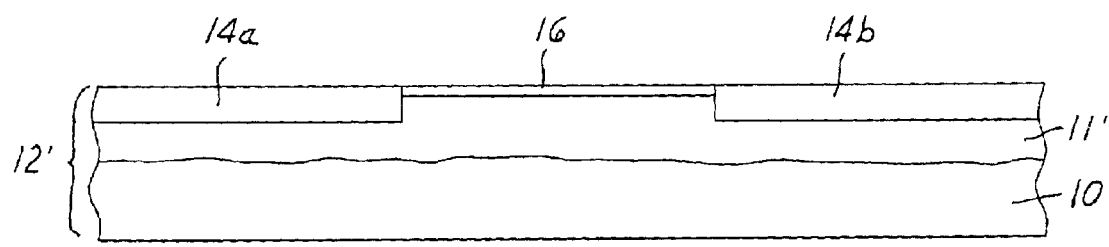

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, there is formed within the epitaxial layer 11 a pair of isolation regions 14a and 14b to thus form from the epitaxial layer 11 a partially etched epitaxial layer 11' which in turn defines an active region of a partially etched epitaxial semiconductor substrate 12'.

Within the preferred embodiment of the present invention, the pair of isolation regions 14a and 14b is, as is illustrated within the schematic cross-sectional diagram of FIG. 3, formed as a pair of shallow trench isolation (STI) regions, typically and preferably formed at least in part of a silicon oxide dielectric material. Other isolation regions formed employing other methods and materials may, however, also be formed and employed within the context of a semiconductor integrated circuit microelectronic fabrication formed in accord with the present invention.

Shown also within the schematic cross-sectional diagram of FIG. 3, and formed upon the active region of the partially etched epitaxial semiconductor substrate 12', is a gate dielectric layer 16.

As is understood by a person skilled in the art, and although gate dielectric layers may be formed employing methods including but not limited to gate dielectric layer thermal growth methods and gate dielectric layer deposition/patterning methods, for the preferred embodiment of the present invention, the gate dielectric layer 16 is typically and preferably formed employing a gate dielectric layer thermal growth method which forms the gate dielectric layer 16 at least in part of a silicon oxide dielectric material formed to a thickness of from about 20 to about 200 angstroms upon the active region of the partially etched epitaxial semiconductor substrate 12'.

Figure 4:
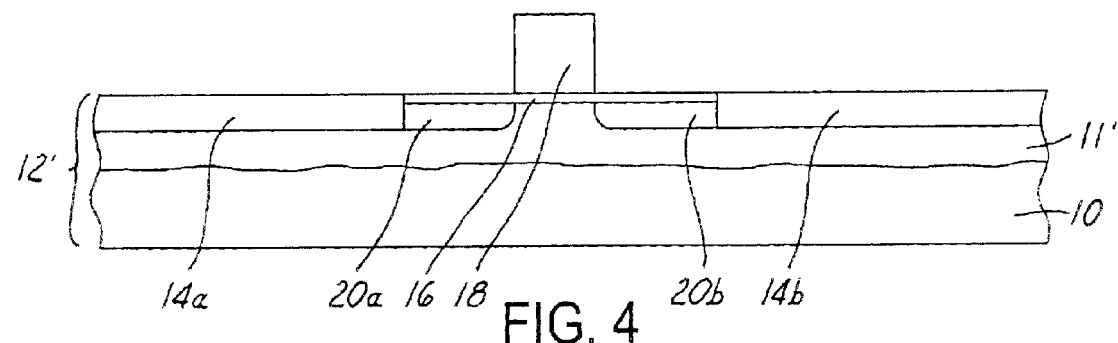

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein: (1) there is formed upon the gate dielectric layer 16 a gate electrode 18; and (2) there is formed into the active region of the partially etched epitaxial semiconductor substrate 12' at regions not covered by the gate electrode 18 a pair of source/drain regions 20a and 20b, to thus form within and upon the active region of the partially etched epitaxial semiconductor substrate 12' whose schematic cross-sectional diagram is illustrated in FIG. 4 a field effect transistor (FET) device.

Within the preferred embodiment of the present invention, the gate electrode 18 and the pair of source/drain regions 20a and 20b may be formed employing methods and materials as are otherwise generally conventional in the art of semiconductor integrated circuit microelectronic fabrication. Typically and preferably, the gate electrode 18 will be formed at least in part of a polysilicon material formed to a thickness of from about 200 to about 2000 angstroms.

Upon forming the field effect transistor (FET) device within the semiconductor integrated circuit microelectronic fabrication whose schematic cross-sectional diagram is illustrated in FIG. 4, there is formed the field effect transistor (FET) device with enhanced performance, insofar as the partially etched epitaxial layer 11' within the partially etched epitaxial semiconductor substrate 12' is formed employing an inert carrier gas which provides the partially etched epitaxial layer 11' with attenuated defects.

EXAMPLES

In order, in part, to demonstrate the value of the present invention, and to assist in defining, in part, preferred operational limitations of the present invention, there was deposited while employing a plasma enhanced chemical vapor deposition (PECVD) method a series of epitaxial silicon semiconductor layers upon a series of (100) bulk silicon semiconductor substrates. When depositing the series of epitaxial silicon semiconductor layers while employing the plasma enhanced chemical vapor deposition (PECVD) method, there was employed otherwise constant plasma enhanced chemical vapor deposition (PECVD) parameters, but with increasing quantities of an argon inert carrier gas.

The plasma enhanced chemical vapor deposition (PECVD) method employed: (1) a reactor chamber pressure of about 40 torr; (2) a source radio frequency power of about 100 watts and a bias power of about 50 watts; (3) a silane flow rate of about standard cubic centimeters per minute (sccm); (4) a hydrogen flow rate of about 100 standard cubic centimeters per minute (sccm); and (5) argon inert carrier gas flow rates of 0, 0.1, 1, 2, 4, 8, 10, 20, 40 and 50 volume percent of the aggregate silane flow rate and hydrogen flow rate.

Each of the epitaxial silicon semiconductor layers was formed to a thickness of about 10000 angstroms.

There was measured for each of the epitaxial silicon semiconductor layers a deposition rate, while employing methods as are conventional in the art of semiconductor integrated circuit microelectronic fabrication.

Figure 5:
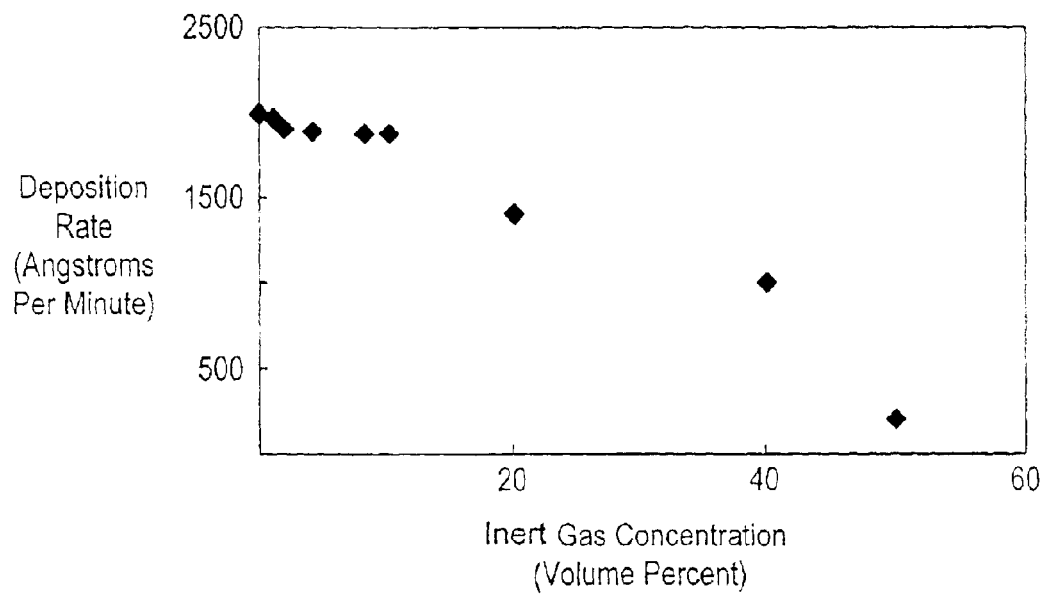
FIG. 5 shows a graph of Deposition Rate versus Inert Gas Concentration for forming an epitaxial silicon semiconductor layer in accord with an example of the present invention.

The resulting measured deposition rates are illustrated in FIG. 5, and plotted as a function of the argon inert carrier gas concentration. As is illustrated within the graph of FIG. 5, there is minimal decrease in deposition rate of an epitaxial silicon semiconductor layer as a function of inert gas concentration up to an inert gas concentration of about fifteen volume percent, beyond which volume concentration a deposition rate for an epitaxial silicon semiconductor substrate layer decreases substantially.

There was also measured for various of the epitaxial silicon semiconductor layers formed in accord with the foregoing examples surface defect densities. The surface defect densities were measured while employing defect density measurement apparatus and methods as are similarly also conventional in the art of semiconductor integrated circuit microelectronic fabrication.

Figure 6:
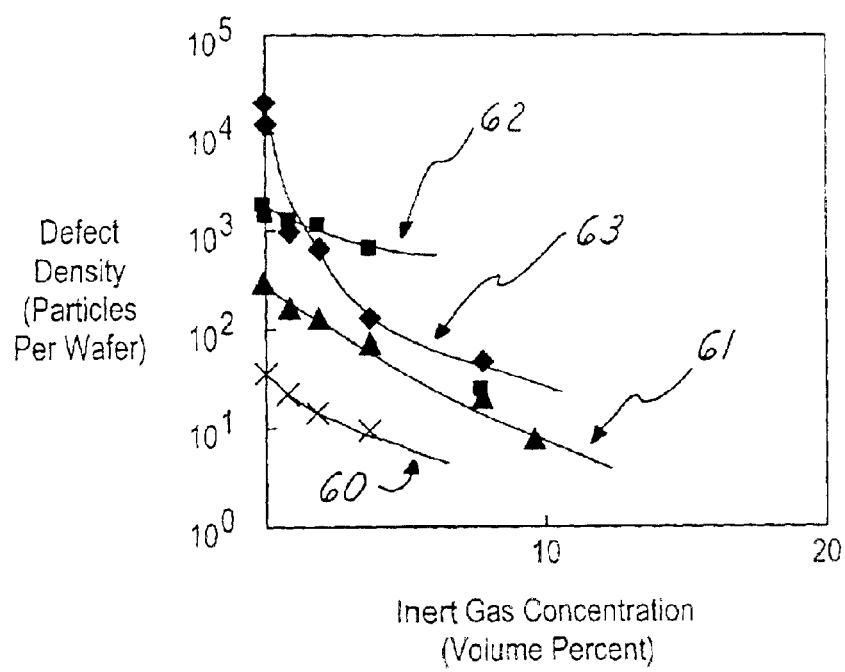
FIG. 6 shows a graph of Defect Density versus Inert Gas Concentration for forming an epitaxial silicon semiconductor layer in accord with an example of the present invention.

The measured defect densities are shown within the graph of FIG. 6, also as a function of inert gas volume concentration. Within FIG. 6, the curve which corresponds with reference numeral 60 corresponds with defect densities measured within a 0.09 micron size range. Similarly, the curve which corresponds with reference numeral 61 corresponds with defect densities measured within a 0.12 micron size range. Yet similarly, the curve which corresponds with reference numeral 62 corresponds with a defect densities measured within a 0.15 micron size range. Finally, the curve which corresponds with reference numeral 63 corresponds with a defect densities measured within a 0.20 micron size range.

As is illustrated within the graph of FIG. 6, there is a general and substantial decrease in defect densities for each of the measured defect density size ranges upon increase in argon inert gas concentration within a plasma enhanced chemical vapor deposition (PECVD) method for forming the epitaxial silicon semiconductor layers. Thus incident to thermal oxidation of the resulting epitaxial silicon semiconductor layers there may be formed gate dielectric layers, and ultimately semiconductor devices, with enhanced performance.

As is understood by a person skilled in the art, the preferred embodiment and examples of the present invention are illustrative of the present invention rather than limiting of the present invention. Revisions and modifications may be made to materials, dimensions and structures employed for forming a semiconductor integrated circuit microelectronic fabrication in accord with the preferred embodiment and examples of the present invention, while still providing a method in accord with the present invention, further in accord with the accompanying claims.

What is claimed is:

1. A method for forming an epitaxial semiconductor layer comprising:
   providing a monocrystalline substrate;
   forming upon the monocrystalline substrate an epitaxial semiconductor layer while employing a plasma enhanced chemical vapor deposition method, the epitaxial semiconductor layer comprising at least one of silicon and germanium, the plasma enhanced chemical vapor deposition method employing a reactant gas composition comprising:
      at least one of a silicon source material and a germanium source material;
      a hydrogen carrier gas; and
      an inert carrier gas, wherein the inert carrier gas is provided at a concentration of from about 0.5 to about 70 volume percent of the aggregate of the at least one of the silicon source material and the germanium source material plus the hydrogen carrier gas.

2. The method of claim 1 wherein by employing the inert carrier gas, the epitaxial semiconductor layer is formed with attenuated defects.

3. The method of claim 1 wherein the substrate is a monocrystalline non-semiconductor substrate.

4. The method of claim 1 wherein the substrate is a monocrystalline semiconductor substrate.

5. The method of claim 1 wherein the inert carrier gas is selected from the group consisting of helium, neon, argon, krypton and xenon.

6. A method for forming an epitaxial semiconductor layer comprising:
   providing a monocrystalline substrate;
   forming upon the monocrystalline substrate an epitaxial semiconductor layer while employing a plasma enhanced chemical vapor deposition method, the epitaxial semiconductor layer comprising at least one of silicon and germanium, the plasma enhanced chemical vapor deposition method employing a reactant gas composition comprising:
      at least one of a silicon source material and a germanium source material;
      a hydrogen carrier gas; and
      an inert carrier gas, wherein the inert carrier gas is provided at a concentration of from about 10 to about 50 volume percent of the aggregate of the at least one of the silicon source material and the germanium source material plus the hydrogen carrier gas.

7. A method for forming an epitaxial silicon semiconductor layer comprising:
   providing a semiconductor substrate;
   forming upon the semiconductor substrate an epitaxial silicon semiconductor layer while employing a plasma enhanced chemical vapor deposition method, the plasma enhanced chemical vapor deposition method employing a reactant gas composition comprising:
      a silicon source material;
      a hydrogen carrier gas; and
      an inert carrier gas, wherein the inert carrier gas is provided at a concentration of from about 0.5 to about 70 volume percent of the aggregate of the silicon source material plus the hydrogen carrier gas.

8. The method of claim 7 wherein by employing the inert carrier gas, the epitaxial silicon semiconductor layer is formed with attenuated defects.

9. The method of claim 7 wherein the semiconductor substrate is a silicon semiconductor substrate.

10. The method of claim 7 wherein the inert carrier gas is selected from the group consisting of helium, neon, argon, krypton and xenon.

11. A method for forming an epitaxial silicon semiconductor layer comprising:
   providing a semiconductor substrate;
   forming upon the semiconductor substrate an epitaxial silicon semiconductor layer while employing a plasma enhanced chemical vapor deposition method, the plasma enhanced chemical vapor deposition method employing a reactant gas composition comprising:
      a silicon source material;
      a hydrogen carrier gas; and
      an inert carrier gas, wherein the inert carrier gas is provided at a concentration of from about 10 to about 50 volume percent of the aggregate of the silicon source material plus the hydrogen carrier gas.

12. A method for forming an epitaxial germanium semiconductor layer comprising:
   providing a semiconductor substrate;
   forming upon the semiconductor substrate an epitaxial germanium semiconductor layer while employing a plasma enhanced chemical vapor deposition method, the plasma enhanced chemical vapor deposition method employing a reactant gas composition comprising:
      a germanium source material;
      a hydrogen carrier gas; and
      an inert carrier gas, wherein the inert carrier gas is provided at a concentration of from about 0.5 to about 70 volume percent of the aggregate of the germanium source material plus the hydrogen carrier gas.

13. A method for forming an epitaxial germanium semiconductor layer comprising:

providing a semiconductor substrate;

forming upon the semiconductor substrate an epitaxial germanium semiconductor layer while employing a plasma enhanced chemical vapor deposition method, the plasma enhanced chemical vapor deposition method employing a reactant gas composition comprising:

a germanium source material;

a hydrogen carrier gas; and an inert carrier gas, wherein the inert carrier gas is provided at a concentration of from about 10 to about 50 volume percent of the aggregate of the germanium source material plus the hydrogen carrier gas.

* * * * *